United States Patent [19]

Rosier

[11] Patent Number: 4,694,430

[45] Date of Patent: Sep. 15, 1987

[54] LOGIC CONTROLLED SWITCH TO ALTERNATE VOLTAGE SOURCES

[75] Inventor: Brian K. Rosier, Jenkintown, Pa.

[73] Assignee: Sprague Electric Company, North Adams, Mass.

[21] Appl. No.: 714,288

[22] Filed: Mar. 21, 1985

[51] Int. Cl.⁴ .............................................. G11C 11/40
[52] U.S. Cl. ...................................... 365/189; 365/226
[58] Field of Search ........................ 365/189, 230, 226

[56] References Cited

U.S. PATENT DOCUMENTS 4,094,012 6/1978 Perlegos et al. ..................... 365/189

OTHER PUBLICATIONS

Miyasaka et al., "Array and G B Logic", ISSCC, Feb. 11, 1982, pp. 182-183.

Ip et al., "Non-Volatile Memories", ISSCC, Feb. 23, 1984, pp. 138-139.

*Primary Examiner*—Terrell W. Fears

[57] ABSTRACT

A supply voltage switch circuit for use with programable arrays such as EPROMS includes a pair of P-channel transistor switches connected in series between a high programing supply voltage and a low read supply voltage wherein the circuit junction between the transistors is connected to a row/column-select supply line. A switch control circuit is connected to the switches to alternately connect the row/column-select supply line to one or the other of the supply voltages in response to a logic signal. A third P-channel transistor may be connected in the series circuit, under control of the logic signal, to prevent destructive transient currents from flowing when powering up the high supply voltage source, at which occasions both of the two principal switches tend to momentarily turn on.

7 Claims, 4 Drawing Figures

LOGIC CONTROLLED SWITCH TO ALTERNATE VOLTAGE SOURCES

BACKGROUND OF THE INVENTION

This invention relates to a voltage switching circuit in an integrated circuit (IC) electrically-programable-read-only memory (EPROM) or the like and more particularly to such a switching circuit for connecting a row/column-select supply line to either a high-voltage source ($V_{pp}$) or a low voltage source ($V_{DD}$).

EPROM devices are usually comprised of an array of floating gate metal oxide semiconductor (MOS) transistors, as are other programable memory array devices. The programing of such arrays entails applying a high voltage to row/column-select and bit lines whereas reading is accomplished by applying a relatively low voltage to row/column-select and bit lines. An EPROM of this kind is described by A. Owens, M. Halfacre and D. Pan in the U.S. patent application Ser. No. 680,198 filed Dec. 10, 1984 and assigned to the same assignee as is the present invention.

It is standard practice to make EPROM and other programable arrays in P-type material wherein N-channel transistors may be simply formed by adding N-type source and drain regions therein. In such EPROM IC chips, the switch circuit for alternately connecting a high and low voltage source to a row/column-select supply line employs two series-connected N-channel transistors between the high and low voltage sources with the junction between them being connected to the row/column-select supply line. Switch control circuitry turns on one of the series connected N-channel transistors when the other is off and vice versa, all in response to a binary logic control signal.

The prior art switch employing a pair of series connected N-channel transistors has the disadvantage that the transistor connected to either voltage source, when rendered conducting, necessarily inserts a voltage drop in the connection between the voltage source and the row/column-select line which is equal to or greater than the characteristic threshold voltage of that transistor. That voltage drop leads to reduced voltage and limited switching speed.

It is an object of the present invention to overcome the above-noted shortcomings of row/column-select supply switching circuits in electrically-programable floating-gate-transistor arrays.

It is also an object of this invention to provide in an integrated circuit array, an FET circuit for alternately connecting to a row/column-select supply bus a source of high supply voltage and a source of low supply voltage without a transistor-threshold drop therebetween.

It is a further object of this invention to provide such an FET circuit that itself is powered from said high and low supply voltage sources.

It is yet a further object of this invention to provide such an FET circuit which connects the row/column-select supply bus to the high and low supply sources, in response to the application at the input of the circuit of a low level logic signal of one kind and the other kind, respectively.

SUMMARY OF THE INVENTION

A switching circuit for connecting a bus such as an EPROM row/column-select supply line, to a high voltage source and, alternately, to a low voltage source has first and second principal P-channel field effect transistor (P-FET) switches. The first principal P-FET switch is connected between a high-positive-supply-voltage circuit node and the output bus, and the channel body region of this first switch is connected to that high voltage node. The second principal P-FET switch is connected between a low-positive-supply-voltage circuit node and the output bus, and the channel body region of this second principal P-FET switch is connected to the output bus. The term 'channel body region' of a transistor as used herein refers to the semiconductor region in which the source drain and channel of that transistor are formed. For example, the channel body region of a P-MOS transistor may be an N-well region formed in a P-substrate. The channel body region of an N-MOS transistor may be the portion of the P-substrate itself in which that N-MOS transistor is formed.

A logic circuit means, having a logic-input conductor and being connected to the gates of the principal switches, is for switching the output bus to the high voltage node when the logic-input signal is at one level and for switching the output bus to the low voltage node when the logic-input signal is at another level. The another level of the logic-input signal that is capable of operating the switching means is preferably the low-voltage of the low voltage node.

The circuit arrangement of P-channel switches is advantageously capable of being gated at zero or ground voltage level and the high voltage of the higher voltage node without inserting a voltage in either of the sources-to-bus connection that is equal to or larger than the characteristic threshold voltage of the switches.

The connection between the first principal switch and the bus may be effected by insertion therein of a protective P-channel transistor switch having its gate connected to the logic-input conductor. The channel body region of the protective P-FET switch is preferably connected to the bus so that this switch may be gated on by a ground voltage and gated off at the low-voltage of the low voltage node.

Since it is desirable that the switching means be responsive to a low voltage logic signal, it is desirable that at least a first transistor stage of the logic circuit means connected directly to the logic-input-conductor be powered from the low-voltage-circuit node.

The peripheral circuits in a programable array integrated circuit are often comprised of N-channel and P-channel active devices operating at a low voltage, and the switching circuit of this invention must be capable of responding to a low voltage level control signal. That requirement poses the problem how to form a circuit at least the front end of which operates at the low supply voltage and which is capable of turning off the principal switch that can connect the high supply voltage node to the output bus. This problem is solved by providing a field effect transistor buffer stage that is connected to the low voltage supply node, receives at its input the low voltage logic signal and is followed by a logic circuit portion that is powered by the high voltage source.

DESCRIPTION OF THE PREFERRED EMBODIMENTS

Figure 1:
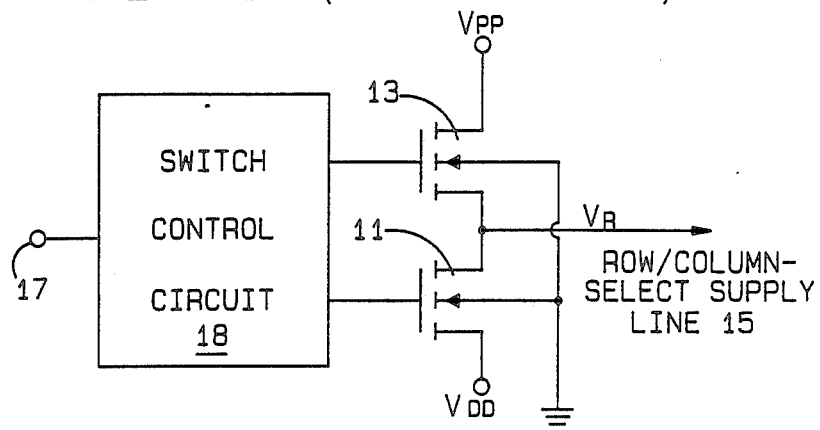
FIG. 1 shows a diagram illustrating an EPROM row-select switch of the prior art.

In order to make the present invention better understood, brief consideration of the above-noted problem in the prior art row/column-select supply switch is given with reference to FIG. 1. A pair of N-channel MOS transistors 11 and 13 are connected between a high voltage source, $V_{pp}$, (e.g., +21 volts) and a low voltage source, $V_{DD}$, (e.g., +5 volts). The junction between transistors 11 and 13 is connected to row/column-select supply line 15.

A switch-control circuit 18 produces a voltage of $V_{DD}$ at the gate of transistor 11 and a voltage of zero volts or ground at the gate of transistor 13 to turn off transistor 13 and to connect the row/column-select supply line to $V_{DD}$ via transistor 11. Because transistor 11 is used in the source follower mode of operation, the row/column-select supply voltage, $V_R$, is equal to $V_{DD}$ minus at least the threshold voltage of transistor 11. This is the case because the source voltage ($V_R$) must be at least more negative than the gate voltage ($V_{DD}$) by the amount of the threshold voltage of transistor 11 to keep it (transistor 11) in conduction. These conditions exist when a first logic signal level is applied to the input 17 of the switch-control circuit 18.

When a second logic signal level is applied to the input 17, then a near zero voltage at the gate of transistor 11 turns it off while a voltage at about the level of $V_{pp}$ is applied to the gate of transistor 13 to turn it on and connect the row/column-select supply line 15 to the high voltage $V_{pp}$. Again because transistor 13 is used in the source follower mode of operation, the row/column-select supply line voltage, $V_R$, is equal to $V_{pp}$ minus at least the threshold voltage of transistor 13.

Figure 2:
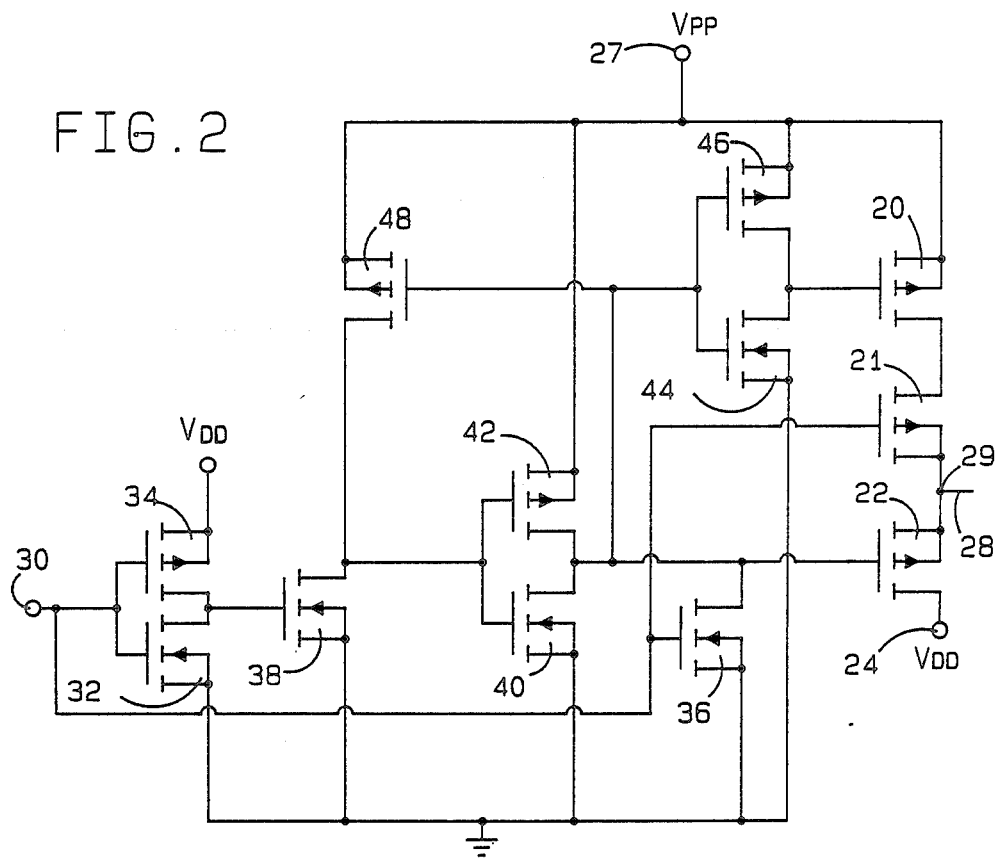
FIG. 2 shows a row/column-select supply switch circuit of the present invention.

Referring now to FIG. 2, three series connected P-channel transistors 20, 21 and 22 are connected between the voltage source terminal 24 at which a low voltage $V_{DD}$ is applied and voltage source terminal 27 to which a high voltage $V_{pp}$ is applied. A row/column-select supply line 28 is connected to the circuit junction 29 between transistors 21 and 22. The channel body region of transistors 21 and 22 are connected to the circuit junction 29 whereas the channel body region of transistor 20 is connected to the high voltage source terminal 27.

In the first realization of this IC, the substrate (not shown) is P-type silicon, and transistors 21 and 22 are formed in one N-well channel body region whereas transistor 20 is formed in a separate N-well channel body region, following standard practice.

The switch control circuit for controlling the principal switching transistors 20 and 22, as well as transistor 21, has a logic input terminal 30 connected to the CMOS stage made up of N-channel transistor 32 and P-channel transistor 34 and thus, the input logic signal at terminal 30 may have logic levels of $V_{DD}$ (e.g., +5 volts) and zero (or ground). The logic input terminal 30 is also connected to the gate of the N-channel transistor 36 and the gate of transistor 21. All of the P-channel (enhancement) transistors have a threshold voltage of about −0.7 volts while of the threshold voltage of all N-channel (enhancement) transistors is about +0.7 volts.

For a logic "0" input condition of 0 volts, transistor 21 is turned on, transistor 36 is held off and the output of the first CMOS stage, transistors 32 and 34, is +5 volts. Under these conditions, transistor 38 is held on, the second CMOS stage composed of transistors 40 and 42 has an output voltage of $V_{pp}$ (e.g., +21 volts) and switching transistor 22 is held off. At the same time, the third CMOS stage composed of transistors 44 and 46 has a zero output voltage rendering the principal switching transistor 20 conducting. The row/column-select supply line voltage is now at 21 volts because the P-channel transistor 20 does not introduce a voltage drop corresponding to its threshold voltage, and P-channel transistor 21 with a gate at zero volts is held on, also with no introduction of a substantial voltage drop between the $V_{pp}$ supply terminal 27 and the row/column-select supply line 28.

When the logic signal applied to input terminal 30 is +5 volts, all of the above-noted conditions are reversed so as to connect the row-select line to $V_{DD}$, +5 volts.

Transistor 21 may be eliminated, and replaced by a direct connection between the drain of transistor 20 and the circuit node 29, without altering the above-described relationship between the input logic signal and the row/column-select supply line voltage, except for a special situation that is further explained below. Also, transistor 48 serves as the load in the drain circuit of transistor 38. Transistor 48 may be replaced by a resistor but, of course, active loads are more efficient with respect to power and space consumption. Transistor 48 is turned on only when transistor 40 is turned on; and transistor 40 is turned on only when transistor 48 is turned on. Transistor 36 was added to initiate turning on both transistors 40 and 48 when transistor 38 is not conducting (when the input logic signal is at the +5 volt level).

Transistor 21 is needed, because at each instance that the voltage sources are being powered up, there is a brief time during which the high voltage at terminal 27 rises through the range from 0 to 5 volts, at which time transistor 20, as well as transistor 22, are turned on leading to a very high and destructive current through the principal transistor switches 20 and 22.

This can occur only when there is a logical "1" signal at the input 30, at which instant of powering up, transistor 22 conducts applying $V_{DD}$ to junction node 29. But at that instant both the gate and source of transistor 20 are at $V_{pp}$ (0 to 5 volts) which is less than $V_{DD}$ in which case transistor 20 may conduct.

This problem may be overcome in another way, e.g., by providing means for temperarily holding the input terminal 30 at zero volts during the powering up period, but transistor 21 represents an elegant solution to this problem.

Figure 3:
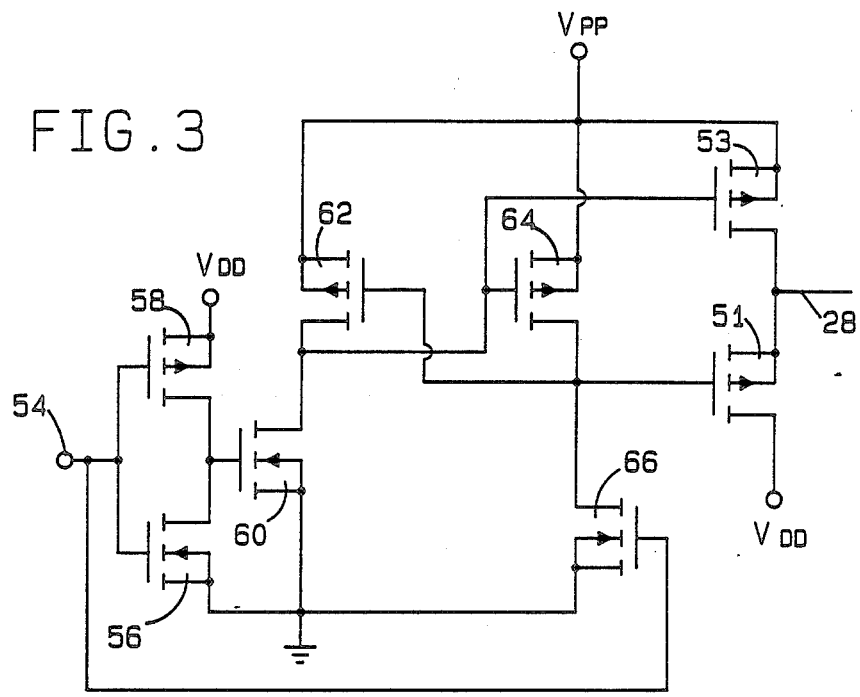
FIG. 3 shows a second row/column-select supply switch circuit of the present invention.

In the second preferred embodiment, illustrated in FIG. 3, two principal switching P-channel transistors 51 and 53 are connected in series between the sources of voltages $V_{DD}$ and $V_{pp}$. A logic signal at input terminal 54, having "1" and "0" levels of $V_{DD}$ volts and 0 volts, respectively, is inverted by the CMOS stage composed of transistors 56 and 58, again inverted by transistor 60 and its load transistor 62 to drive the principal switching transistor 53. Transistors 64 and 66 invert the signal to drive the other principal transistor switch 51 in the opposite condition.

Figure 4:
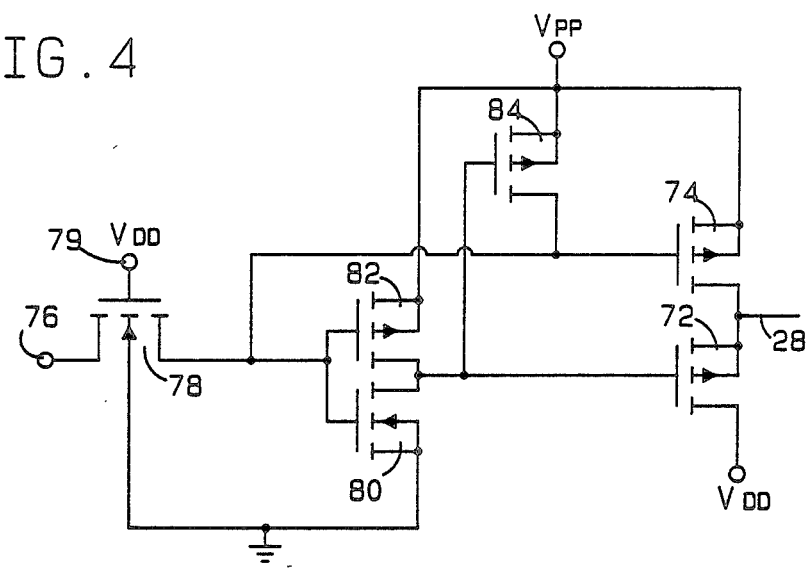
FIG. 4 shows a third row/column-select supply switch circuit of this invention.

In a third preferred embodiment illustrated in FIG. 4, two principal switching transistors 72 and 74 are connected in series between the sources of voltages $V_{DD}$ and $V_{pp}$. A logic signal at input terminal 76, having a $V_{DD}$ voltage level (corresponding to a logical "1") renders non-conducting the input transistor 78 with the gate tied to the low supply voltage $V_{DD}$ at terminal 79. Thus, the voltage at the input of the CMOS stage composed of transistors 80 and 82 is not held to any particular voltage. However, if that CMOS stage input voltage floats down to less than $V_{DD}$ minus the threshold voltage (e.g., 0.7 volts) of the transistor 78, transistor 78 turns on and the output voltage of the CMOS stage becomes zero turning on transistor 84 which in turn locks the CMOS stage input at $V_{pp}$. If, on the other hand, the input of the CMOS stage initially floats above the above-noted $V_{DD}$ minus the threshold voltage of transistor 78, then transistor 78 remains off but the CMOS stage is locked by the same transistor 84 feedback path to produce a zero output. This simple scheme remains reliable so long as the sum of the threshold voltages of transistors 78 and 80 is less than $V_{DD}$. Thus, for a "1" signal at input terminal 76, the voltage on the row/column-select supply line 28 is $V_{DD}$ and for a "0" signal input the row/column-select supply line voltage is $V_{pp}$.

In the second and third preferred embodiments represented in FIGS. 3 and 4, respectively, a means similar to that shown (transistor 21) in FIG. 1 for preventing the simultaneous conduction of the principal switching transistors is omitted in the interest of simplicity. However, the use of such a preventative means is similarly appropriate in all three circuits.

What is claimed is:

1. A switching circuit for alternately connecting a bus to a high voltage source and to a low voltage source comprising:
   (a) a first circuit node adapted to be connected to a source of positive high voltage;
   (b) a second circuit node adapted to be connected to a source of positive low voltage;
   (c) an output bus;
   (d) a first principal P-channel field-effect transistor switch connected drain-to-source between said first node and said output bus, respectively, the channel body region of said first P-channel transistor switch being connected to said first node;
   (e) a second principal P-channel field-effect transistor switch connected source-to-drain between said second node and said output bus, respectively, the channel body region of said second principal switch being connected to said output bus;
   (f) a logic circuit means having an input conductor and being connected to the gates of said principal switches for gating off one at a time said first and second principal switches and for simultaneously gating on the other of said principal switches and for only gating on said one and the other principal switches when a logic-one and logic-zero signal, respectively, are alternately applied to said input conductor.

2. The switching circuit of claim 1 additionally comprising a protective P-channel transistor switch having a gate connected to said input conductor, wherein said drain of said first switch is connected to said output bus via said protective switch drain-to-source.

3. The switching circuit of claim 1 wherein said logic circuit means is comprised of:
   (a) a CMOS stage powered between said second node and a circuit groundpoint having an input connected to said input conductor;
   (b) a first N-channel transistor having a gate connected to the output of said CMOS stage;
   (c) a first P-channel transistor having the source connected to said first node and the drain connected to the drain of said first N-channel transistor;
   (d) a second P-channel transistor having the source connected to said first node and the gate connected to said drains of said first N-channel and first P-channel transistors, the gate of said first principal switch also being connected to said drains of said first N-channel and said first P-channel transistors;
   (e) a second N-channel transistor having a gate connected to said input conductor and the drain connected to the gate of said first P-channel transistor, the drain of said second P-channel transistor and the gate of said second principal switch.

4. The switching circuit of claim 1 wherein said logic circuit means is comprised of (a) a CMOS stage powered between a circuit ground point and said first circuit node and having an output connected to the gate of said second switch (b) a first N-channel transistor having a drain/source connected to said input conductor, a source/drain connected to the input of said CMOS stage and the gate connected to said second node; and (c) a P-channel transistor having the source connected to said first node, the drain connected to said CMOS-stage input and the gate connected to said CMOS-stage output and the gate of said first switch.

5. A semiconductor integrated switching circuit, for connecting an output thereof to a high positive voltage source when the input of said switching circuit is at one logic voltage level and for connecting said output to a relatively low positive voltage source when the input of said circuit is at another logic level, comprising a plurality of P-channel enhancement MOS transistors (P-FET's), a plurality of N-channel enhancement MOS transistors (N-FET's), an input conductor, an output conductor, a high-voltage-source node, a low-voltage-source node and a ground node all being interconnected as follows:
   (a) a first of said P-FET's being connected between said output conductor and said low-voltage-source node;
   (b) a second and third of said P-FET's forming one series circuit branch that is connected from said output conductor to said high-voltage-source terminal, in that order;
   (c) all of said P-FET's having N-type channel body regions, said N-type regions being ohmically connected to said high-voltage-source terminal except that the N-type channel body regions of said first and second P-FET's are connected to said output conductor; all of said N-FET's having P-type channel body regions and sources being connected to said ground node;
   (d) the gate of said second P-FET being connected to said input conductor;
   (e) one and another CMOS pairs of said transistors each being connected between said ground node and said high-voltage-source node, the output of said one-CMOS-pair being connected to the gate of said third P-FET, and the another-CMOS-pair output being connected to the gate of said first P-FET and to the input of said one CMOS pair;
   (f) a third of said N-FET's connected in series with a sixth of said P-FET's between said ground and high-voltage-source nodes, the drains of said third N-FET and sixth P-FET being connected to each other and the input of said another CMOS pair;

(g) yet another CMOS pair of said transistors being connected from said ground node to said low-voltage-source node and having an input connected to said input conductor and an output connected to the gate of said third N-FET; and (h) a fifth of said N-FET's having a gate connected to said input conductor and having a drain connected to the output of said another CMOS pair, the input of said one CMOS pair and the gate of said sixth P-FET.

6. The switching circuit of claim 1 wherein said logic means is comprised of a buffer stage connected directly to said second circuit node, and a high voltage logic portion connected directly to said first circuit node and having an output connected to the gate of said first principle transistor switch.

7. The switching circuit of claim 1 wherein said logic circuit means is comprised of at least one CMOS stage.

* * * * *